United States Patent

Siebers

[15] 3,679,916

[45] July 25, 1972

[54] CONTROLLED HYSTERESIS INTEGRATED CIRCUIT SWITCHING CIRCUIT

[72] Inventor: Holger Siebers, Zug, Switzerland

[73] Assignee: Landis & Gyr AG, Zug, Switzerland

[22] Filed: July 17, 1970

[21] Appl. No.: 55,843

[30] Foreign Application Priority Data

Sept. 16, 1969 Switzerland ........................13958/69

[52] U.S. Cl. ..........................................307/290, 307/230
[51] Int. Cl. ..................................................H03k 3/295
[58] Field of Search ....................................307/290, 230

[56] References Cited

UNITED STATES PATENTS

| | | | |
|---|---|---|---|
| 3,529,184 | 9/1970 | Conklin | 307/290 |
| 3,018,386 | 1/1962 | Chase | 307/290 X |
| 3,191,073 | 6/1965 | Mooney | 307/290 X |

*Primary Examiner*—Roy Lake
*Assistant Examiner*—James B. Mullins
*Attorney*—Morgan, Finnegan, Durham & Pine

[57] ABSTRACT

A controlled hysteresis integrated circuit switching circuit wherein a bias signal and an input signal are connected in opposition across the input of an operational amplifier. A current source establishes the bias signal across a bias resistor. When the input signal overcomes the bias signal, the amplifier begins to change state. The output of the amplifier controls an active feedback network and, as the amplifier changes stage, a predetermined amount of current is switched to the bias resistor in opposition to that supplied by the current source to reduce the magnitude of the bias signal.

1 Claim, 2 Drawing Figures

PATENTED JUL 25 1972

3,679,916

INVENTOR.

HOLGER SIEBERS

BY

Morgan Finnegan Durham & Pine

ATTORNEY

CONTROLLED HYSTERESIS INTEGRATED CIRCUIT SWITCHING CIRCUIT

BACKGROUND AND BRIEF SUMMARY OF THE INVENTION

This invention relates to a switching amplifier in monolithic integrated circuit technology. Switching amplifiers are frequently used in threshold switches which contain, in addition to the switching element, an initial voltage or current source to establish the threshold value. A known threshold switch of this type is shown in FIG. 1.

The threshold switch of FIG. 1 has an operational amplifier 1 with a regenerative coupling network consisting of resistors 2 and 5 associated therewith. A direct current source 3 having a voltage $-U_B$, and a voltage divider consisting of the resistors 4 and 5 are used to establish the threshold voltage. The input voltage $U_G$ is supplied by a voltage source 6 having an internal resistance represented by resistor 7. The values of resistors 2 and 4 and the input resistance of operational amplifier 1 are very great in relation to the value of resistor 5.

The operation of the threshold switch of FIG. 1 is as follows: When the input voltage $U_G$ has the value of 'zero,' the output voltage $U_A$ of the operational amplifier, which may be either $+U_A$ or zero, also has the value of 'zero.' Across resistor 5 is a voltage drop which corresponds to the threshold voltage and which is determined by the voltage $-U_B$ and resistors 4 and 5. If the input voltage $U_G$ is sufficiently negative so as to compensate for the threshold voltage, then the regenerative switching process occurs because of the positive regenerative coupling, when the switching condition $A \cdot H = 1$, is fulfilled. In this formula, $A$ represents the amplification of the operational amplifier and $H$ represents the regenerative coupling factor which is determined approximately by the ratio of resistors 5 and 2.

Immediately after switching, the voltage drop across resistor 5 is decreased (made less negative) as a direct result of the regenerative coupling, by an amount which is approximately equal to the product of the voltage change at the output of operational amplifier 1 and the ratio of the values of resistors 5 and 2. To cause the output of the operational amplifier to revert to the zero condition, the input voltage $U_G$ must now be more positive than during the preceding switching, namely by the amount of the voltage change across resistor 5 as a result of switching. The difference between these two values of the input voltage required to change the state of the threshold switch in each direction is called the "hysteresis voltage." Thus, the hysteresis voltage is approximately proportional to the ratio of the resistances 5 and 2.

Often the threshold switches are required which operate with very low threshold voltages. This necessitates that the hysteresis voltage be very low. To accomplish this, values for resistors 5 and 2 are chosen which differ by several powers of ten. In monolithic integrated circuits technology, however, resistors can only be manufactured within a range of values of approximately 200 ohms to 20,000 ohms. Therefore, the maximum possible resistance ratio has a value of about a hundred. Generally this is too small for threshold switches with a low threshold voltage.

In the integrated circuit switching amplifier according to the invention, the aforesaid disadvantage is avoided in that upon regenerative switching a current source is switched-over by the amplifier output and supplies a predetermined current to the resistor which established the threshold voltage, thereby controlling the hysteresis.

BRIEF DESCRIPTION OF THE DRAWINGS

An illustrative embodiment is described in the following detailed specification which includes the drawings and wherein.

DETAILED DESCRIPTION

Figure 1:
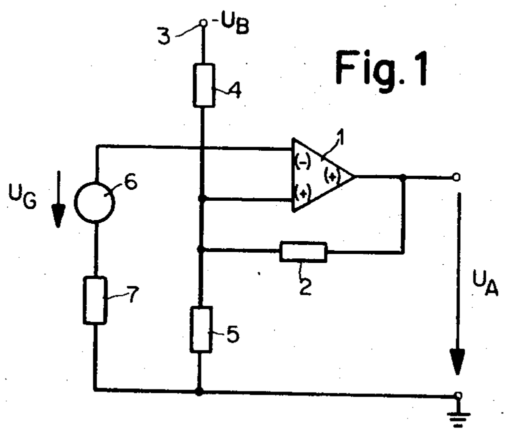
FIG. 1 is a schematic diagram of a known threshold switch.
Figure 2:
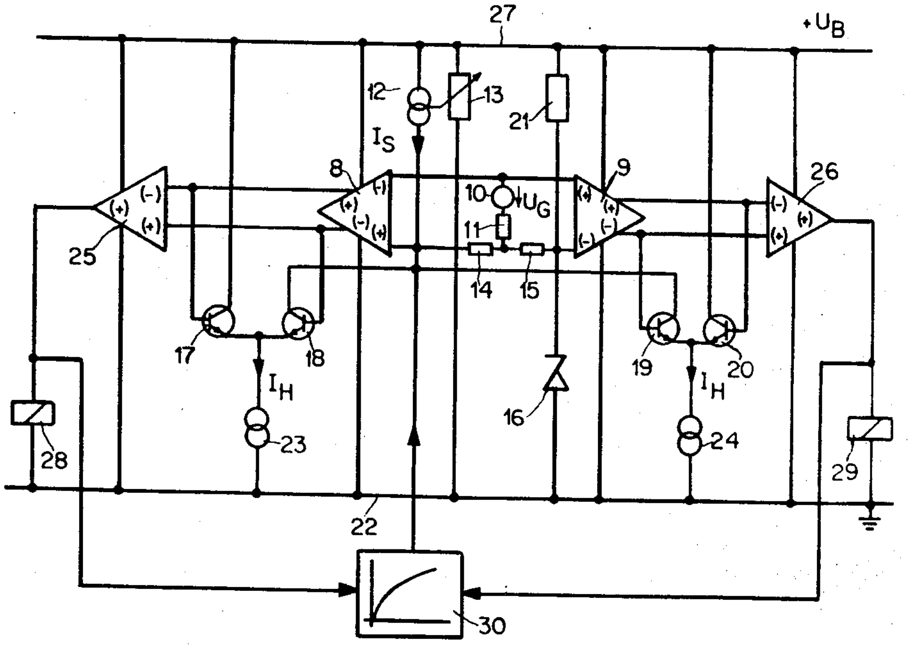
FIG. 2 is a schematic diagram of a threshold switch embodying the principles of the invention.

FIG. 2 shows an integrated circuit threshold switch with a three-point switching characteristic. Two push-pull amplifiers 8 and 9 are provided with a common input voltage source 10 having internal resistance 11, and a common current source 12 which produces a predetermined current $I_S$ for establishing the threshold values. Resistor 13 indicates that in the event of fluctuations of the supply voltage $+U_B$, the current $I_S$ varies correspondingly. The current $I_S$ takes the path through resistors 14 and 15 and Zener diode 16 rather than through push-pull amplifiers 8 and 9 since the input resistances of the latter are very great.

Transistors 17 through 20, which are controlled by the outputs of amplifiers 8 and 9, are connected so that when the input voltage $U_G$ has the value of zero, transistors 17 and 20 are conductive and transistors 18 and 19 are blocked. Transistors 17, 18 and 19, 20 respectively form differential amplifiers so that with a zero input voltage current $I_S$ cannot flow through transistors 18 or 19.

The voltage drop which the current $I_S$ produces across resistors 14 and 15 represents the threshold voltages for amplifiers 8 and 9 respectively. If both resistors have the same value, the threshold voltages are equal. Voltage source 10 forms, with each of the resistors 14 and 15, a series circuit which is connected to the inputs of the associated amplifiers. The threshold voltages developed across resistors 14 and 15 are oppositely directed, i.e., the threshold voltages have different plus and minus signs, with respect to the input voltage $U_G$.

The initial voltage which is required for the push-pull amplifiers is produced by resistor 21 and Zener diode 16. Current sources 23 and 24 are connected respectively between the emitters and transistors 19, 20, and ground. These current sources are fed by the stabilized voltage developed across Zener diode 16, which voltage is transformed into the two predetermined currents $I_H$ by an arrangement of transistors and resistors (not shown).

The collectors of transistors 18 and 19 are connected to one input of amplifier 8, to the current source 12 and to resistor 14. Switching amplifiers 25 and 26 are connected to the outputs of amplifiers 8 and 9 and function to furnish the necessary switching power for relays 28 and 29 connected to the outputs thereof. Amplifiers 25 and 26 change state between the switching points in such a manner that their outputs may only be conductive or blocked. This ensures that there is minimal power loss in the semiconductor material.

The outputs of switching amplifiers 25 and 26 are connected to one input of push-pull amplifier 8 via a feedback member 30 which is common to both switching amplifiers. The feedback member has a time-characteristic which may be selected to satisfy particular design parameters. In this manner the behavior of the illustrated switching amplifier may be made compatible with existing control technology.

The voltage $+U_B$ impressed across leads 27 and 22 provides the power to push-pull amplifiers 8 and 9 and to switching amplifiers 25 and 26.

The illustrated threshold switch functions as follows: Only the operation relating to push-pull amplifier 9 will be described in detail since amplifier 8 behaves in a similar manner.

The current $I_S$ produces a voltage drop across resistor 15 which corresponds to the threshold voltage. If the input voltage $U_G$ has the value of zero, then because of the threshold voltage, the output voltage of amplifier 9, which is forward biased, is such that transistor 19 is blocked and transistor 20 is conductive. The output of switching amplifier 26 has the potential of lead 22, and relay 29 is deenergized.

If the input voltage $U_G$ is sufficiently negative so that it compensates the threshold voltage, then the output voltage of push-pull amplifier 9 changes in such manner that transistor 19 begins to conduct. The collector current of transistor 19 flows from lead 27 through resistors 21, 15 and 14. The collector current of transistor 19, which is essentially the constant emitter current $I_H$, causes a voltage drop across resistor 15 which adds to the change in the input voltage $U_G$ which initially caused transistor 19 to conduct. Thus the circuit switches regeneratively. During the switching, the output voltage of amplifier 9 changes its plus or minus sign, thus turning off transistor 20. Immediately upon changing state, switching amplifier 26 energizes relay 29. However, this process has already concluded before the new initial state of push-pull amplifier 9 is achieved.

In order to cause amplifier 9 to switch back to its initial state, the input voltage $U_G$ must be more positive than the input voltage which originally caused the output voltage of amplifier 9 to change, more positive by an amount approximately equal to the product of $I_H$ and the value of resistor 15. This amount therefore corresponds to the hysteresis voltage of the switching characteristic. Since the current $I_H$ is very low and can be controlled very exactly, the result is an integrated circuit switching amplifier with a very small hysteresis.

After amplifier 9 switches back, transistors 19 and 20 are in their original condition and relay 29 is deenergized.

Amplifier 8 changes its output voltage when the input voltage $U_G$ is positive and the threshold value, established by $I_S$ and resistor 14, is reached. Amplifier 8 switches back at an input voltage which is more negative than the input voltage which originally caused the output voltage of amplifier 8 to change, more negative by an amount approximately equal to the voltage drop produced across resistor 14 by the current $I_H$ flowing through transistor 18. Thus, the three-point threshold switch as illustrated has a mirror-image symmetrical switching characteristic.

The voltage $+U_B$ preferably also serves as the operating voltage for the device which produces the input voltage $U_G$. Thus $U_G$, just like the current $I_S$ and/or the threshold voltages, becomes dependent upon variations in the voltage $+U_B$. However, since the input voltage $U_G$ and the threshold voltage compensate one another, the control system itself is independent of supply voltage fluctuations.

Of course, the subject-matter of the invention may also be used for threshold switches having two-point switching characteristics, and which therefore require only one amplifier.

What is claimed is:

1. In a controlled hysteresis integrated circuit switching circuit, the combination of an amplifier;

biasing means connected to said amplifier for providing a bias signal for normally biasing said amplifier, said biasing means including a source of constant current and at least one resistive element connected in series therewith to develop said bias signal across said resistive element, said resistive element being connected in series with the input of said amplifier;

an input circuit for receiving an input signal and including said biasing means, connected to said amplifier so that said amplifier begins to change state when said input signal overcomes said bias signal; and a differential amplifier circuit connected between the output of said amplifier and said biasing means for modifying said bias signal by causing current to flow through said resistive element in a predetermined amount in opposition to current flow from said source and in response to the change of state of said amplifier to thereby establish the hysteresis of said switching circuit.

* * * * *